(12) United States Patent
Gasse et al.

(10) Patent No.: US 8,841,151 B2
(45) Date of Patent: Sep. 23, 2014

(54) METHOD OF MANUFACTURING A LIGHT EMISSION DEVICE BASED ON LIGHT EMITTING DIODES

(75) Inventors: Adrien Gasse, Grenoble (FR); Philippe Gilet, Teche (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 175 days.

(21) Appl. No.: 13/390,998

(22) PCT Filed: Jul. 22, 2010

(86) PCT No.: PCT/FR2010/051553
§ 371 (c)(1),
(2), (4) Date: Mar. 8, 2012

(87) PCT Pub. No.: WO2011/020959
PCT Pub. Date: Feb. 24, 2011

(65) Prior Publication Data
US 2012/0164767 A1 Jun. 28, 2012

(30) Foreign Application Priority Data
Aug. 18, 2009 (FR) ...................................... 09 55697

(51) Int. Cl.
*H01L 21/00* (2006.01)
(52) U.S. Cl.
USPC ............... 438/34; 438/28; 977/762; 977/811; 977/932; 977/950; 977/952
(58) Field of Classification Search
USPC ............. 438/28, 34; 977/762, 811, 932, 950, 977/952
See application file for complete search history.

(56) References Cited

U.S. PATENT DOCUMENTS

| 7,511,308 B2 * | 3/2009 | Kim et al. | 257/79 |
| 7,541,623 B2 * | 6/2009 | Yi et al. | 257/98 |
| 7,816,700 B2 * | 10/2010 | Kim | 257/98 |
| 7,981,714 B2 * | 7/2011 | Kim et al. | 438/48 |
| 8,022,432 B2 * | 9/2011 | Yi et al. | 257/99 |

(Continued)

FOREIGN PATENT DOCUMENTS

| WO | WO2007055468 | 5/2007 |
| WO | WO2007141333 | 12/2007 |

OTHER PUBLICATIONS

Kikuchi et al., InGaN/GaN Multiple Quantum Disk Nanocolumn Light-Emitting Diodes Grown on (111) Si Substrate, Japanese Journal of Applied Physics. V43, pp. L1524-L1526 (2004).

*Primary Examiner* — Bac Au
(74) *Attorney, Agent, or Firm* — Jordan IP Law, LLC; Todd A. Vaughn

(57) ABSTRACT

A method of manufacturing a device based on LEDs includes the growth of semiconducting nanowires on a first electrode produced on an insulating face, and encapsulation thereof in planarizing material; the formation, on the planarizing material, of a second electrode with contact take-up areas. LEDs are formed by releasing a band of the first electrode around each take-up area, including forming a mask defining the bands on the second electrode, chemically etching the planarizing material, stopped so as to preserve planarizing material, chemically etching the portion of nanowires thus released, and then chemically etching the remaining planarizing material. A trench is formed along each of the bands as far as the insulating face and the LEDs are placed in series by connecting the take-up areas and bands of the first electrode.

20 Claims, 12 Drawing Sheets

(56) References Cited

U.S. PATENT DOCUMENTS

| | | | |
|---|---|---|---|
| 8,263,990 B2* | 9/2012 | Armitage | 257/97 |
| 8,535,962 B2* | 9/2013 | Gilet et al. | 438/29 |
| 2003/0168964 A1* | 9/2003 | Chen | 313/495 |
| 2005/0062049 A1 | 3/2005 | Lin et al. | |
| 2006/0169993 A1 | 8/2006 | Fan et al. | |
| 2008/0142823 A1* | 6/2008 | Moon et al. | 257/98 |

\* cited by examiner

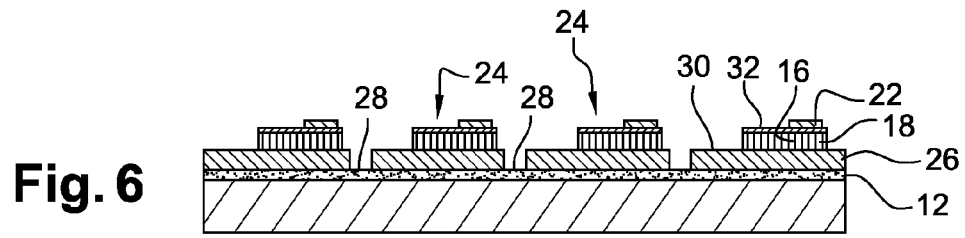
Fig. 6
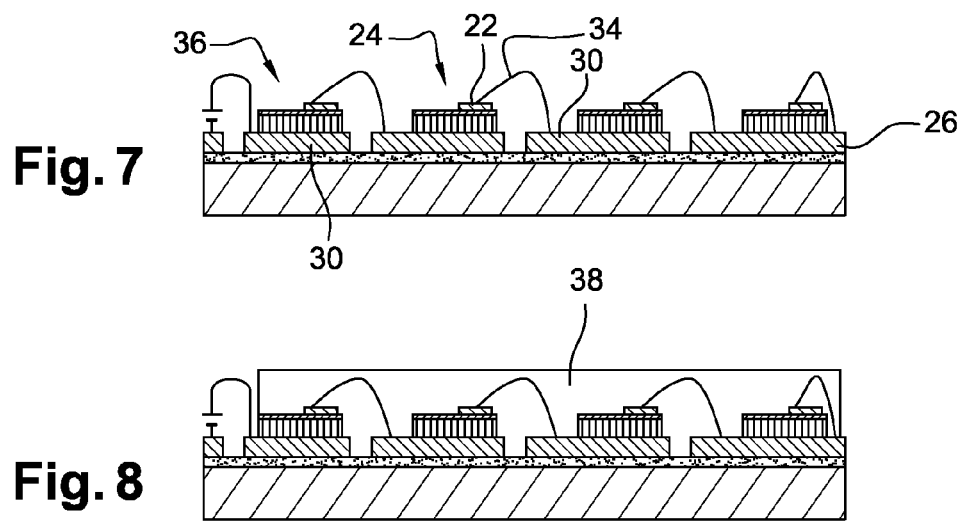
Fig. 7
Fig. 8
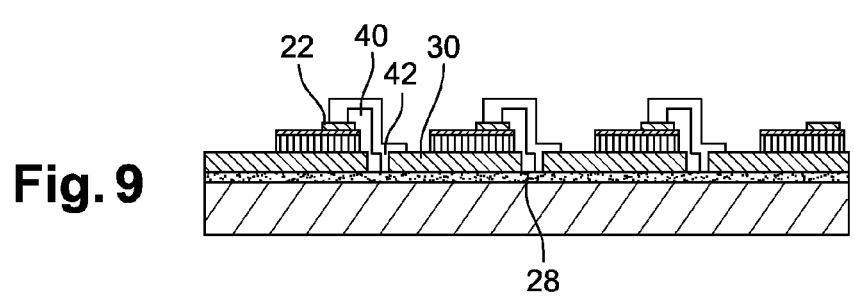
Fig. 9
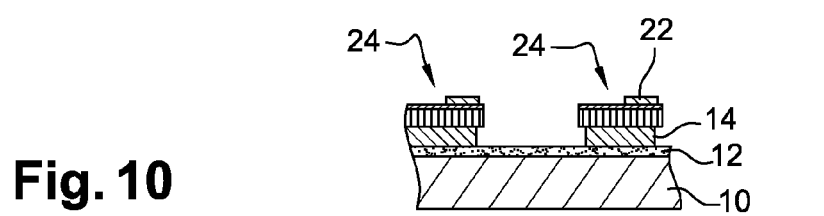
Fig. 10

METHOD OF MANUFACTURING A LIGHT EMISSION DEVICE BASED ON LIGHT EMITTING DIODES

CROSS-REFERENCE TO RELATED APPLICATIONS

The present application is a National Stage Application of PCT International Application No. PCT/FR2010/051553 (filed on Jul. 22, 2010), under 35 U.S.C. §371, which claims priority to French Patent Application No. 0955697 (tiled on Aug. 18, 2009), which are each hereby incorporated by reference in their respective entireties.

FIELD OF THE INVENTION

The present invention relates to the field of the manufacture of light emission devices based on light emitting diodes, in particular, emission devices of high brightness and with a large surface area.

BACKGROUND OF THE INVENTION

Usually a light emission device based on LEDs (the acronym for light emitting diodes) consists of a stack of semiconductor layers produced by epitaxy on a sapphire or silicon carbide (SiC) substrate having a mesh parameter suited to the material of the semiconductor layers. A plurality of diodes is usually simultaneously produced to the scale of a wafer, and then the diodes are individualised by cutting. The single chips thus obtained are then attached, according to the application, to a supporting substrate known as a PCB (printed circuit board) of a light system for electrical supply thereof, the number of chips attached to the PCB being chosen according to the brightness required for the lighting system.

The manufacture of this type of LED, however, remains complex and expensive since it requires very many steps, in particular steps of thinning and/or shrinkage of the epitaxial growth substrate and, where applicable, a step of attaching the LEDs to a PCB.

But especially, an important proportion (approximately 80%) of the electrical energy injected into such LEDs is converted into heat. In doing this, not only is the efficiency of such diodes low, but the service life thereof is substantially shortened if they suffer significant heating. Problems of thermal dissipation are thus posed, all the more so when a high brightness of the lighting system, and therefore a large number of diodes, is required. In fact, thermal dissipation remains the main reason why this type of LED does not become more widespread.

The electrical supply to an LED is usually limited to a few watts in order to avoid heating thereof to temperatures above 150° C. and/or active diode cooling devices (fan, Peltier effect module, etc.) are provided in the lighting system.

In order to reduce the thermal resistances opposing good dissipation of heat (in particular, the high thermal resistance of the layers for holding the LEDs on a board), the LEDs can also be directly integrated on the board (then "chip on board" is spoken of), which eliminates the thermal resistances related to the transfer. However, the integration operations are complex and the gain in thermal dissipation insufficient.

Recently LEDs based on nanowires have appeared, the advantage of which is not requiring a match in mesh between the material constituting an LED and the nanowire growth substrate. A wide choice of substrate is thus possible, not only sapphire and SiC, and in particular, substrates affording good thermal dissipation of the heat produced by the LED, such as for example metals. Reference can for example be made to the document WO 2007/141333 for a detailed description of the manufacture of such an LED.

Although the number of manufacturing steps is more limited, because in particular of the substrate, which is not removed, the LEDs are still produced simultaneously and then individualised and the individualised LEDs attached to a PCB or integrated directly on a board. In fact, the steps of constructing a lighting system are still numerous and the transfer of the LEDs onto a PCB or integration thereof on a board causes numerous thermal resistances reducing the efficacy of the heat dissipation.

SUMMARY OF THE INVENTION

An aim of the present invention is to solve the aforementioned problem by proposing a simple method of manufacturing a light emission device based on LEDs with a large surface area, and therefore high brightness, having improved heat dissipation characteristics.

To this end, a first method includes: forming a support which forms a heat exchanger; forming a first electrode on the support; growing semiconducting light-emitting nanowires on the first electrode; encapsulating the nanowires in a planarising material; forming, on the planarising material, a second electrode configured to at least partially transmit the light emitted by the nanowires.

In accordance with the invention, the support has an electrically insulating face on which the first electrode is formed.

The first method also includes: forming areas for taking up electrical contact on the second electrode; forming the light emitting diodes by: releasing a band of the first electrode around each contact take-up area, including forming a mask defining the bands on the surface of the second electrode; conducting a first chemical etching of the planarising material, the chemical etching being stopped so as to preserve planarising material on the first electrode; conducting a second chemical etching of the portion of nanowires released from the planarising material during the first chemical etching; and then conducting a third chemical etching of planarising material remaining at the end of the first chemical etching; and then forming a trench along each of the bands as far as the electrically insulating face of the support; and then placing the light emitting diodes in series by electrically connecting the electrical contact take-up areas and the bands of the first electrode.

Another subject matter of the invention is a second method provided for this purpose, the method including: forming a support for forming a heat exchanger; forming a first electrode on the electrically insulating face of the support; growing light-emitting semiconducting nanowires on the first electrode; forming, on a free end of the light-emitting semiconducting nanowires, a second electrode able at least partially to transmit the light emitted by the nanowires.

In accordance with the invention, the support has an electrically insulating face on which the first electrode is formed; the free ends of the light-emitting semiconducting nanowires are splayed and contiguous so as to form a support for the second electrode; and the first electrode is produced from a material substantially inert to a predetermined chemical etching of the light-emitting semiconducting nanowires.

The second method also includes: forming electrical contact take-up areas on the second electrode; forming the light emitting diodes by releasing a band of the first electrode around each contact take-up area including the formation of a mask defining the bands on the surface of the second electrode and the application of the predetermined chemical etching; and then forming a trench along each of the bands as far as the electrically insulating face of the support; and then putting the light emitting diodes in series through the electrical connection of the electrical contact take-up areas and the bands of the first electrode.

In essence, the nanowire-based LEDs are always designed simultaneously on a support. In accordance with the invention, however, the support has an electrically insulating face for subsequently individualising the chips without physical separation thereof. In addition, the layer of material forming the first electrode of each LED is left clear sufficiently to over a parallel surface to the support and used to put the LEDs electrically in series. There is, therefore, no longer any need to use a printed board for the individual supply of the LEDs, thus minimizing the thermal resistance of the whole. The LEDs, therefore, advantageously remain on a support chosen so as to be a good dissipater, and include, for example, fins.

In addition, the bands of the first electrode have a large surface area for contact take-up when the LEDs are put in series, while avoiding over-etching during the formation of the trenches.

In accordance with the invention, the formation of the support can include forming heat-dissipation fins on the face opposite to the electrically insulating face.

In addition, the formation of the support can also include depositing an insulating layer on an electrically conductive substrate. This insulating layer may, for example, be composed of a layer of inorganic material, in particular, diamond, AlN, SiC, BN, or $Si_3N_4$ or $SiO_2$.

In accordance with the invention, the first electrode can include a first layer of interconnection material, in particular, composed of Ti, Cr, TiN or WN, and a second thin layer, deposited on the first layer, the second layer composed of a material having a high electrical conductivity, in particular, Cu, Au, Ag, W, Ni or Pd. The first layer enables the second layer to be attached.

The nanowires referred to above advantageously are composed of ZnO. In addition, the first electrode is composed of, for example, a layer of ZnO.

The electrical connections are advantageously produced by wiring, in particular with Au wire.

Advantageously, a luminophore material is deposited on the second electrode in order to define and adjust the colour of the light emission.

BRIEF DESCRIPTION OF THE DRAWINGS

The present invention will be understood better from a reading of the following description, given solely by way of example and produced in relation to the accompanying drawings, in which identical references designate identical or similar elements, and in which:

FIGS. 1 to 8 illustrate a method of manufacturing a diode-based light emission device in accordance with the invention.

FIG. 9 is a schematic view illustrating a variant interconnection of the diodes.

DETAILED DESCRIPTION OF EMBODIMENTS

FIGS. 1 to 8 illustrate the main steps of a method of manufacturing an LED-based light emission device in accordance with the invention.

Figure 1:

As illustrated in FIG. 1, the method begins with the formation of a monolithic or multilayer substrate 10. Apart from the function of support for elements constituting the LED-based light emission device, the substrate 10 is chosen so as to present a high thermal conductivity in order to dissipate the heat produced by the LEDs that will subsequently be formed thereon. The substrate 10 preferentially takes the form of a radiator with fins, as will be explained in more detail hereinafter.

The material or materials which form the substrate 10 are preferably selected from good thermal conductors. For example, the substrate 10 may be composed of one or more metals, or metal alloys, such as copper (Cu), silver (Ag), tungsten (W), aluminium (Al), molybdenum (Mo), nickel (Ni), vanadium (V), palladium (Pd), platinum (Pt), titanium (Ti) and iron (Fe). The substrate 10 can also be composed of a composite with a metal matrix (such as, for example, Al—SiC (aluminium-silicon carbide), Al—Si (aluminium-silicon), Cu-diamond) or a doped semiconductor (based on Si, gallium arsenide (GaAs), gallium phosphide (GaP), silicon carbide (SiC), aluminium nitride (AlN) or boron nitride (BN)), or a polychrystalline ceramic, doped or not (based on diamond, graphite, AlN, SiC, $Si_3N_4$, $B_4C$ or WC or more generally all transition metal carbides and nitrides).

Figure 2:
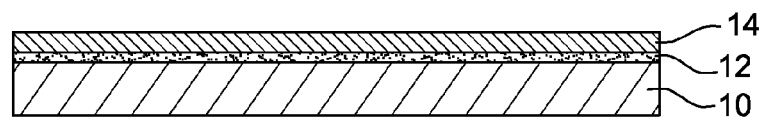

As illustrated in FIG. 2, in the case where the substrate 10 is electrically conductive, the method continues with the formation on the substrate 10 of a thin layer 12, of a few micrometers thick (for example, 5 micrometers), both electrically insulating and with a high thermal conductivity. The layer 12 is preferably composed of an inorganic material such as diamond or one of the derivatives thereof, such as DLC for example, (standing for "diamond like carbon"), a ceramic such as AlN, SiC or BN, or an inorganic material such as $Si_3N_4$ or $SiO_2$. Preferentially, the layer 12 is a layer of polychrystalline diamond, for example deposited according to a chemical vapour deposition (CVD) technique at a temperature of 800° C. for example.

An electrically conductive layer 14, of a few micrometers thick, is then deposited on the insulating layer 12. Layer 14 preferentially has high electrical conductivity. The function of the layer 14 is to electrically connect the nanowires that will subsequently be formed thereon to the same potential. The conductive layer 14 thus forms a first electrode. The conductive layer 14 is, for example, a metal layer formed from Cu, Au, W, Ni or Pd. The conductive layer 14 is, in a variant, produced from the same material of the subsequently formed nanowires, as will be explained in more detail below. The thin layer 14 is, for example, produced by way of cathodic sputtering, thermal evaporation or electrolysis.

Optionally, a bonding layer (not shown), of a few tens of micrometers, may first deposited on the insulating layer 12. The bonding layer, for example, can be formed from Ti, Cr, TiN or WN, thus increases the adhesion of the conductive layer 14 deposited thereon. The bonding layer is preferentially used when the conductive layer 14 is of the metal type and the insulating layer 12 is made from an inorganic material, the adhesion of a metal to an inorganic material being low.

Figure 3:
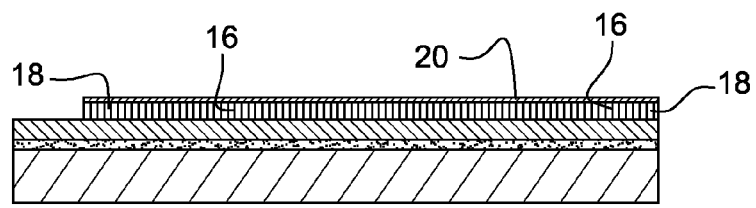

As illustrated in FIG. 3, the method continues with the growth of nanowires 16 of semiconductor material on the conductive layer 14. Each nanowire 16 includes at least one stack of a first semiconductor area of a first type, for example n type, a second semiconductor area including heterostructures of quantal multiwells, this area forming the active light-emission area, and a third semiconductor area of the type opposite to the first area, for example, p type. For example, the semiconductor material which forms the nanowires is GaN, zinc oxide (ZnO), Si, GaAs or GaP. The heterostructures of quantal multiwells are then formed from an alloy based on InGaN for nanowires based on GaN or an alloy based on ZnMgO for alloys based on ZnO. It should be noted that the second area including the heterostructures is optional. In the case where this is omitted, the active light-emission area is formed by the interface between the two remaining semiconducting areas.

Optionally, and prior to the growth of the nanowires 16, a reflective layer (not shown) is deposited on the conductive layer 14 or the material of the conductive layer 14 is also chosen for its reflective qualities. For example, a layer of Ag, Au or Al is deposited on the layer 14.

The nanowires 16 are then advantageously encapsulated in an electrically insulating layer 18, for example made from a dielectric material such as benzocyclobutene (BCB) or polystyrene or an inorganic material such as $SiO_2$. The encapsulation layer 18 is deposited so that the ends of the nanowires 16 project beyond it. The encapsulation layer 18 is designed to confer good flatness and is produced, for example, in the case of an inorganic material such as $SiO_2$, by way of a deposition method of the sol-gel type (better known by the expression "spin-on-glass" (SOG)), or of the PECVD ("plasma enhanced chemical vapour deposition") type.

An electrically conductive layer 20 at least partially transparent to the light emitted by the nanowires is then formed on the encapsulation layer 18 so as to encompass the free end of the nanowires. The layer 20 thus forms a second electrode for the nanowires while not obscuring the light emitted by them. The layer 20 is, for example, formed from a conductive semi-transparent material such as ITO (indium tin oxide) or zinc oxide (ZnO) or a fine layer of nickel (Ni), a few nanometers thick (for example, 5 nanometers), covered with a fine layer of Au a few nanometers thick also (for example, 5 nanometers).

Figure 4:
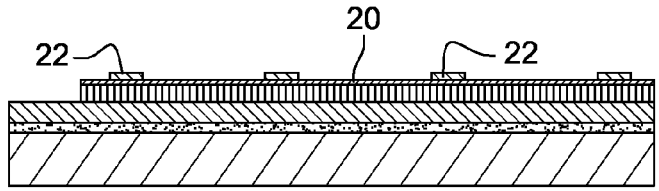

As illustrated in FIG. 4, electrical contact take-up areas 22, for example metal, are then produced in a regular pattern on the layer 20.

The steps of forming the nanowires 16, encapsulating them in the layer 18, forming the second electrode 20 and producing the electrical contact take-up areas 22 are, for example, described in WO 2007/141333.

Figure 5:
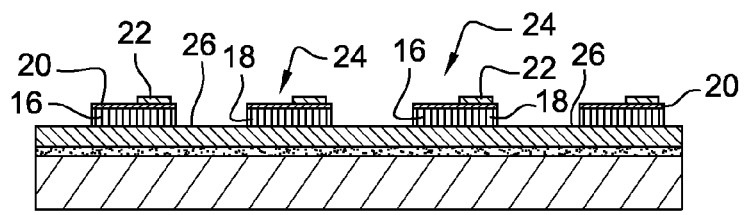

As illustrated in FIG. 5, the method continues with the individualisation of the elementary emissive areas 24, each having a contact take-up area 22. To do this, a masking of the elementary emissive areas 22 is effectuated, and then various successive etching steps are implemented in order to eliminate the non-masked portions of the second electrode 20, the encapsulation layer 18 and the nanowires 16, in order to release the first electrode 14. The individualisation step will be explained in more detail below. A free or exposed surface 26 of the said first electrode at least partially projects beyond each elementary area 24, or surrounds it.

As illustrated in FIG. 6, the elementary emissive areas 24 are next electrically insulated by photolithography, etching or laser ablation. A trench 28 is thus produced around each elementary emissive area 24 in the first electrode 26 as far as the insulating layer 12. A light emission device based on light emitting diodes based on nanowires 24 is thus obtained, and includes a first elementary electrode 30 on which there are formed nanowires 16 encapsulated in an encapsulation layer 18 and covered with a second elementary electrode 32, on which an electrical contact take-up area 22 is formed.

As illustrated in FIG. 7, the method next continues with putting the light emitting diodes 24 in electrical series. Advantageously, the putting in series is carried out by way of an Au wire 34 connecting a contact take-up area 22 of a diode 24 with the first elementary electrode 30 of an adjacent diode, for example, by way of the so-called "wire ball" or "wedge bonding" technique. The first elementary electrode 30 of a peripheral diode 36 is then connected by a Au wire to electrical terminals which include, for example, a portion of the conductive layer 12.

It should also be noted that the formation of the contact take-up areas and the formation of the elementary emission areas advantageously use masking techniques. It is thus possible to arrange the electrical contact take-up areas and the accessible surface of the first elementary electrode so as to minimise the electrical resistance between the elementary emission areas.

As illustrated in FIG. 8, finally, the method ends with the deposition of a luminophore material layer 38 on the assembly thus obtained in order to define and adjust the final emission colour. For example, when the diodes 24 emit a blue colour, a white-light emission device is produced using a luminophore material layer 38 of the YAG garnet type doped with Ce, such as, for example, $Y_3Al_5O_{12}:Ce^{3+}$.

As illustrated in FIG. 9, a variant electrical interconnection of the light emitting diodes is illustrated. In this variant, an electrically insulating passivation layer 40 is first of all deposited partially on each contact take-up area 22 and the bottom of the trench 28, for example, an inorganic passivation layer of $SiO_2$ or $Si_3N_4$, or an organic passivation layer of silicone, epoxy, acrylic, polyimide or benzocyclobutene. A metal layer 42 is then deposited on the free surface of the area 22 and of the trench 28 and partially covers the first elementary electrode 30 of an adjacent light emitting diode.

In a variant, the electrical connection of the light emitting diodes is effected by way of a collective interconnection with a large surface area, such as, for example, metal conductive lines produced by screen printing of a conductive adhesive, such as an adhesive with an Ag filler made conductive by crosslinking, or by a jet of conductive ink, such as an ink based on Ag nanoparticles that is made conductive by low-temperature sintering.

Wire interconnection of the light emitting diodes is, however, preferred in the case of a flexible substrate 10. This is because the use of a nanowire-based light emitting diode technology allows the use of a wide variety of substrates, and in particular, flexible substrates particularly advantageous in LCD backlighting systems, luminous panels for industrial or domestic lighting or the like. The use of wire interconnections between the diodes also ensures, when the substrate is deformed, that the diodes are still connected without rupture of the interconnection thereof. Electrical interconnection with a large surface area (adhesive, ink, deposition of layer) for its part is advantageous in diode-based light emitting devices with a very large surface area. The techniques of using these materials are in fact easier to implement for large surfaces.

An individualisation of the light emitting diodes has been described in which portions of the second electrode 20, of the encapsulation layer 18 and of the nanowires are eliminated in order to reveal elementary emissive areas 24 (See FIG. 5).

As illustrated in FIG. 10, a frequent problem is illustrated of lateral over-etching appearing if the elimination of the nanowires is effected without any special precaution. As can be seen, when the nanowires are eliminated, for example, by chemical etching, the first electrode 14 may undergo an undesired etching that eliminates a good portion thereof between the emissive areas 24, but also under the emissive areas 24. In fact, the electrical interconnection of the first elementary electrode of a diode with the contact take-up area 22 on an adjacent diode is difficult since it is necessary to connect a surface concealed under the emissive area 24.

Embodiments of steps of individualisation of the light emitting diodes for GaN and ZnO nanowire materials will now be described. It will obviously be understood that these embodiments associated with the materials are not limitative, and serve both to explain the general principle of individualisation and the specificities of the individualisation with regard to the material which composes the nanowires.

Figure 11:
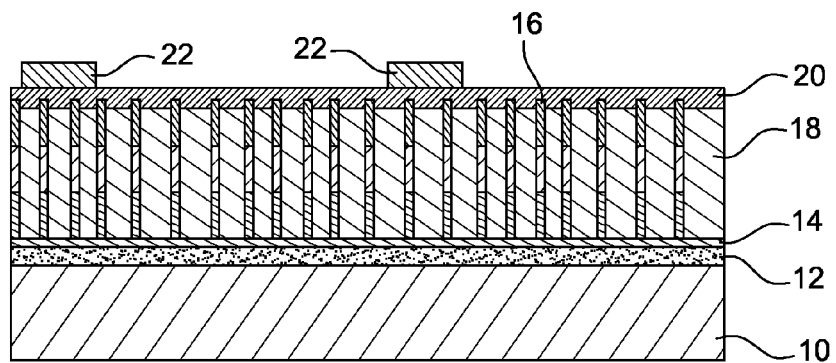
FIGS. 11 to 21 illustrate in more detail the steps of individualisation and electrical connection of the LEDs for low-density GaN nanowires.

FIGS. 11 to 21 describe the individualisation of light emitting diodes based on encapsulated GaN nanowires, with FIG. 11 corresponding to an enlarged view of FIG. 4 with a metal substrate.

Figure 12:
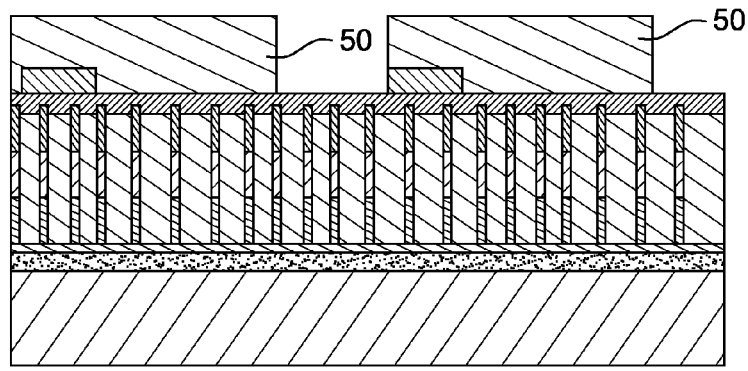

As illustrated in FIG. 12, the individualisation of the emissive areas begins with the deposition of a masking resin 50 defining the areas where the trenches 28 will be produced, for example, by lithography.

Figure 13:
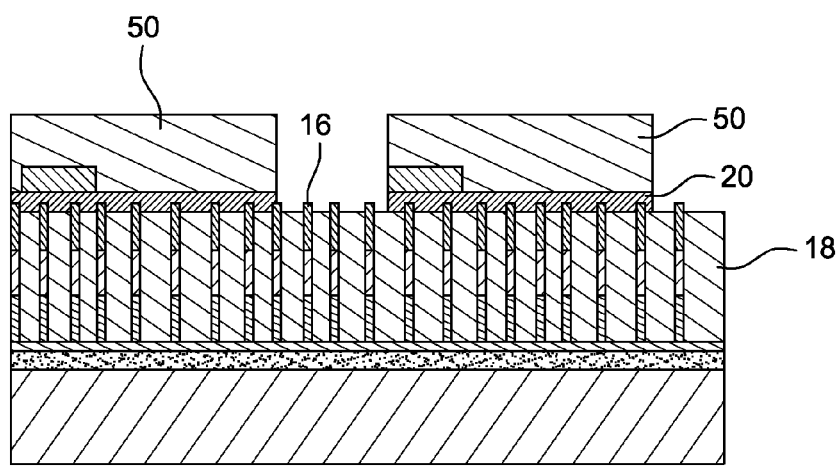

As illustrated in FIG. 13, a reactive ion etching, or RIE, is then implemented in order to eliminate the portion of the non-masked second electrode 20. This etching, based on a methane/hydrogen/argon chemistry, is chosen so as to attack the electrode 20 selectively and not to attack the flattening encapsulation layer 18 and the nanowires 16.

Figure 14:
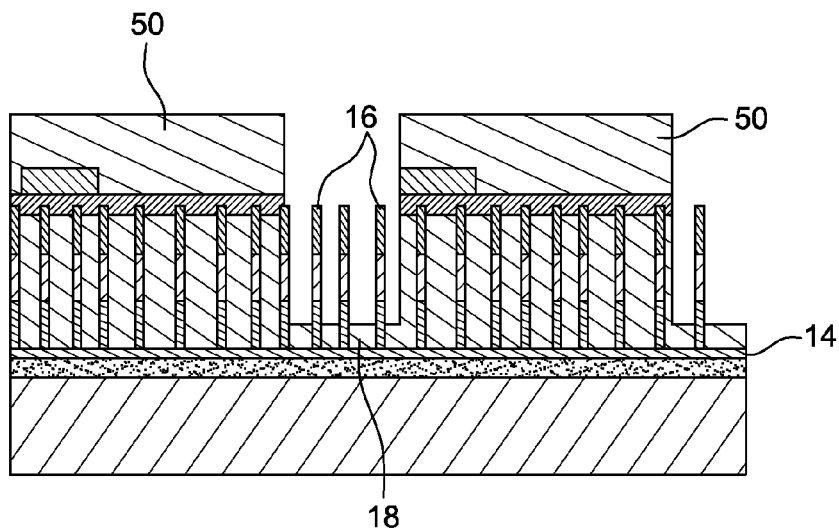

As illustrated in FIG. 14, an RIE etching based on fluorinated chemistry of the $CHF_3/O_2$ type is then carried out in order to partially eliminate the portion of non-masked encapsulation layer 18. In accordance with the invention, a small thickness of the encapsulation layer 18 is left at the bottom of the etching, for example, a thickness of a few tens of nanometers, such as, for example, between 20 and 200 nm. The function of this thickness is to mask the conductive layer 14 when the nanowires 16 are eliminated. For example, a calibration of the speed of etching of the encapsulation layer 18 is carried out on reference plates and is adjusted, for example, to approximately 100 nm/min.

It should be noted that the remaining thickness of the encapsulation layer at the etching bottom does not require high precision. It is only necessary to ensure the presence of such a thickness in order to produce a mask protecting the conductive layer 14 during subsequent etching of the nanowires. As will be apparent hereinafter, the invention takes advantage of the fact that portions of nanowires may remain at the bottom of the trenches 28 formed in order to individualise the elementary emissive areas, the remaining thickness of the encapsulation layer 18 adjusting the height of the remaining portions of the nanowires. Obviously it is preferable for this nanowire height to be minimal but the residues of nanowires may advantageously be embedded in a metal layer if required.

Figure 15:
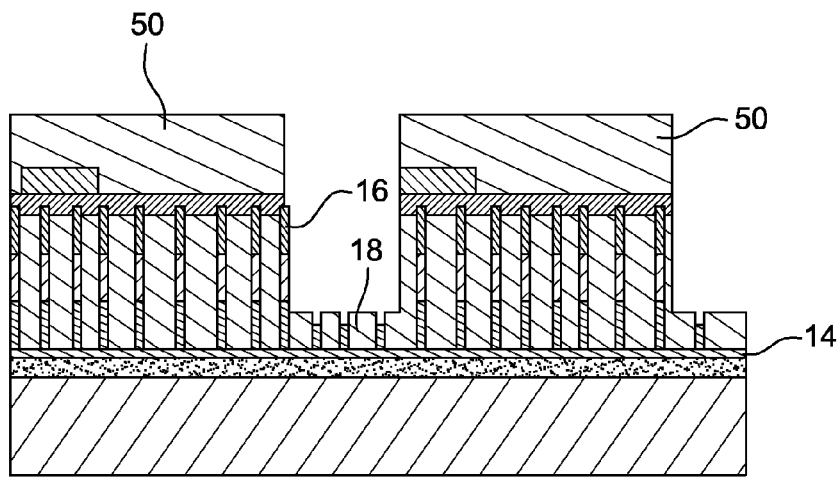

As illustrated in FIG. 15, the individualisation then continues with the implementation of an RIE etching based on $SiCl_4/Cl_2$ for the selective elimination of the non masked nanowires. An over-etching of the nanowires 16 is thus noted, a portion of these encapsulated in the remaining thickness of the layer 18 having been eliminated. It should be noted, however, that the conductive layer 14 is intact.

Figure 16:
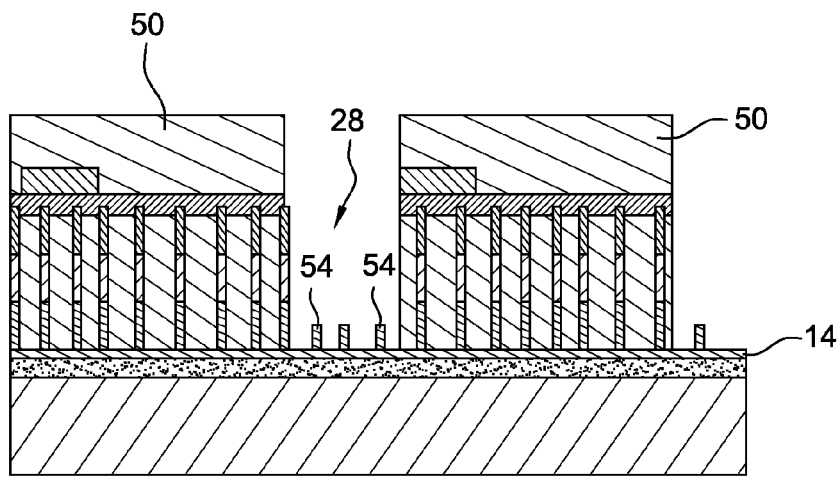

As illustrated in FIG. 16, an RIE etching of the remaining thickness of the encapsulation layer 18 is then carried out. This selective etching does not attack the conductive layer 14 or the nanowires and thus leaves residues of nanowires 54 at the bottom of the trench. These residues 54 form ohmic contacts with the conductive layer 14, and therefore, do not constitute an interference in the subsequent functioning of the light emission device based on light emitting diodes.

Figure 17:
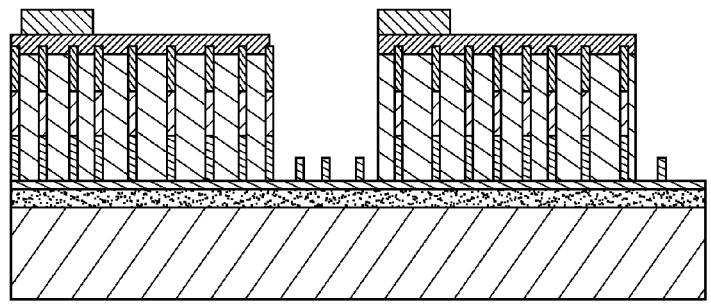

As illustrated in FIG. 17, the masking resin 50 is then eliminated, for example, by an acetone bath followed by an $O_2$ plasma in order to make all the resin residues disappear.

Figure 18:
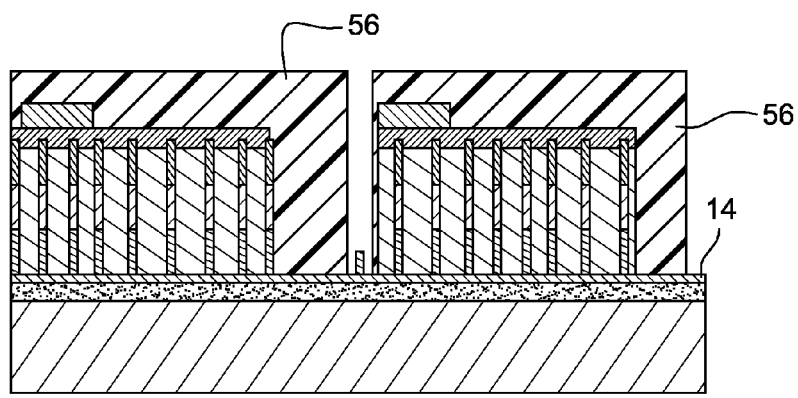

As illustrated in FIG. 18, a new resin 56, for example, formed by lithography, is then deposited on the assembly obtained in order to define the etching areas of the conductive layer 14.

Figure 19:
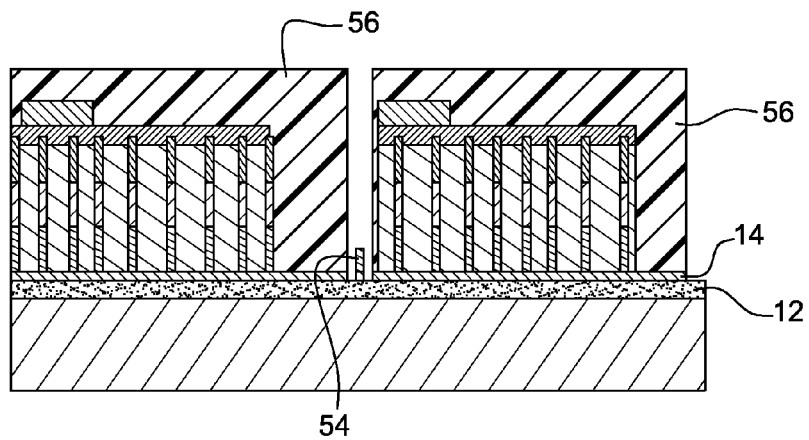

As illustrated in FIG. 19, then an etching is carried out as far as the insulating layer 12. If the conductive layer 14 is produced from Au or Ag, a wet chemical etching based on iodine and potassium iodide is implemented. If the layer 14 is produced from titanium, an RIE etching based on $SF_6$ or based on fluorinated chemistry is implemented. If the layer 14 is made from TiN, an RIE etching based on fluorinated chemistry is implemented. Finally, for noble metals, of the Pt type, the etching of the conductive layer 14 is an ion etching, or IBE (ion beam etching). It should be noted that a judicious choice of the material constituting the layer 14 and of the type of etching makes it possible to eliminate the non-masked nanowire residues 54. For example, a wet etching will overetch the portion of conductive layer 14 under these residues.

Figure 20:
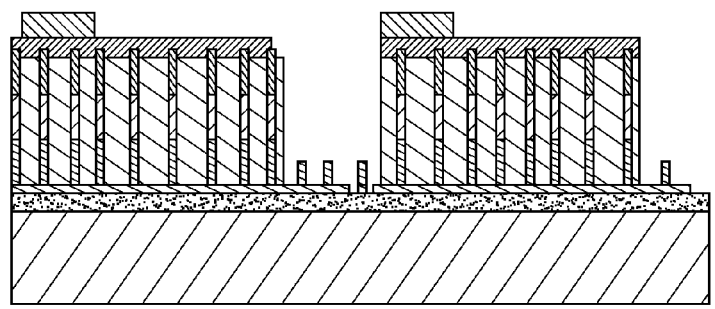

As illustrated in FIG. 20, the resin 56 is then eliminated, for example, by way of an acetone bath followed by the application of an $O_2$ plasma.

Figure 21:
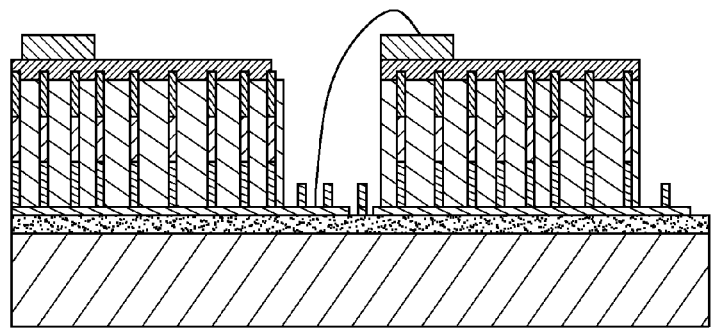

As illustrated in FIG. 21, a wire interconnection between two adjacent diodes is then carried out between the freed surface of the first electrode of a diode, with the contact take-up area 22 formed on the second electrode of the other diode.

FIGS. 22 to 35 illustrate the individualisation of the light emitting diodes based on ZnO nanowires.

Figure 22:
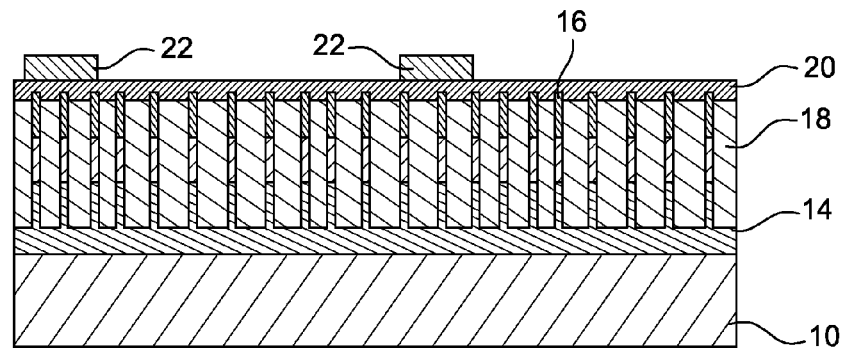
FIGS. 22 to 35 illustrate in more detail the steps of individualisation and electrical connection of the LED for ZnO nanowires.

As illustrated in FIG. 22, the ZnO nanowires 16 are advantageously directly designed on an insulating or semi-insulating substrate 10, for example, formed from sapphire or silicon. The substrate 10 thus also fulfils the role of the insulating layer 12 previously described.

When the nanowires 16 are grown, in particular by MOCVD (metal-organic chemical vapour deposition), a continuous layer of ZnO, referred to as a buffer layer, around a hundred nanometers thick, is also formed. This buffer layer thus fulfils the role of the conductive layer 14 previously described and electrically connects the nanowires 16 together. The planarising encapsulation layer 18 is composed of, for example, an inorganic material, such as $SiO_2$, and is formed, for example, by way of a deposition of the sol-gel type or a PECVD deposition. The layer 20 forming the second electrode is composed of a material of the ITO type. The electrical contact take-up areas 22 are metal dual-layer areas of the Ti/Au or Ni/Au type.

Figure 23:
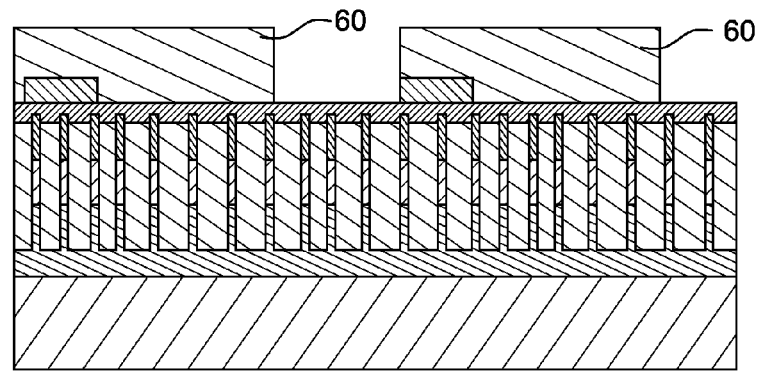

As illustrated in FIG. 23, the individualisation of the diodes begins with the deposition of a resin mask 60 by photolithography.

Figure 24:
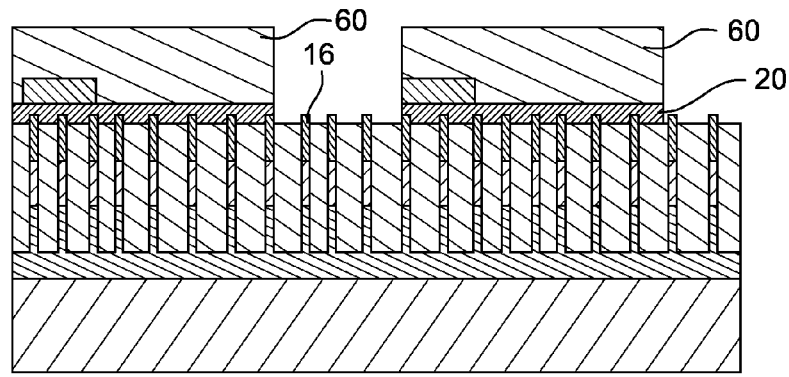

As illustrated in FIG. 24, then a selective etching of the layer 20 of the RIE type based on methane/hydrogen/argon chemistry is conducted.

Figure 25:
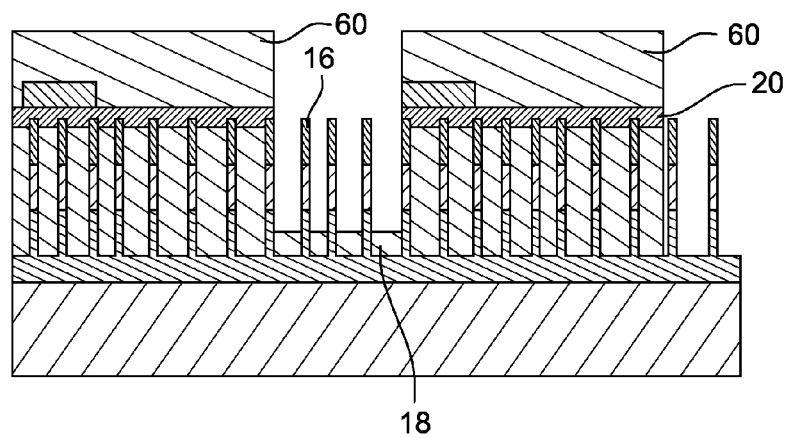

As illustrated in FIG. 25, the encapsulation layer 18 then undergoes an RIE etching based on fluorinated chemistry of the $CHF_3/O_2$ type in a manner similar to that described previously in relation to FIGS. 11 to 20.

Figure 26:
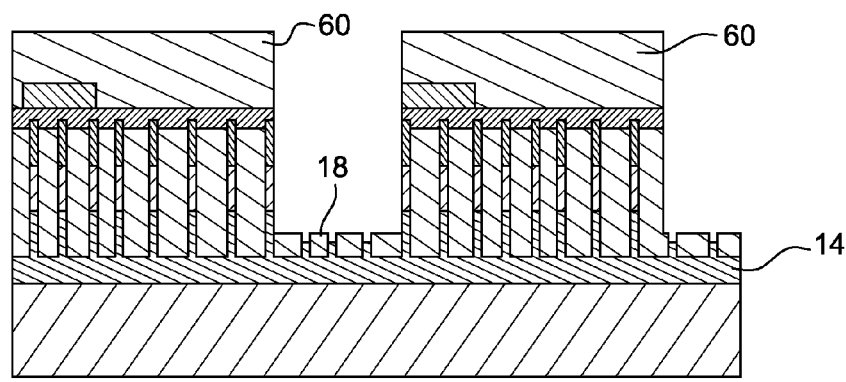

As illustrated in FIG. 26, the non-masked nanowires are then etched by way of a slow RIE etching (around 10 nm/min)

based on ammonium chloride, the thickness of the remaining encapsulation layer forming a mask for the conductive buffer layer 14.

Figure 27:
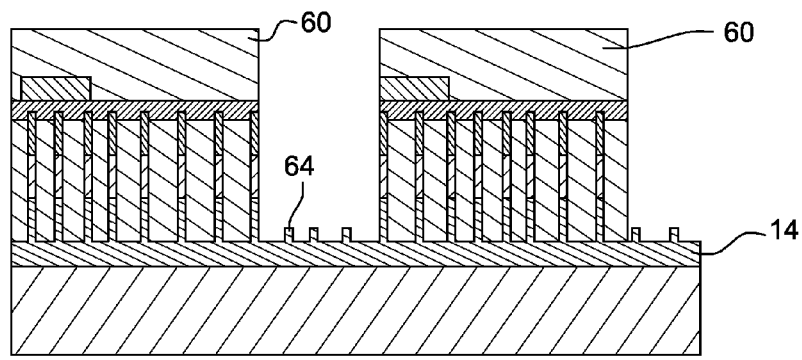

As illustrated in FIG. 27, the rest of the encapsulation layer 18 is then removed by means of fluorinated RIE etching. Just like the embodiment previously described, nanowire residues 64 may be preset but do not constitute an interference in themselves since they form simple ohmic contacts with the conductive buffer layer 14.

Figure 28:
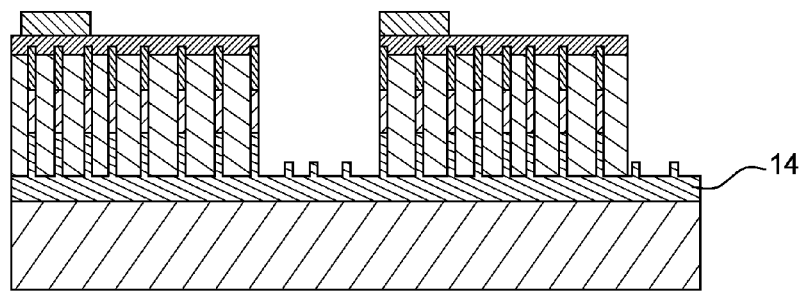

As illustrated in FIG. 28, the resin mask 60 is then removed by way of an acetone bath followed by the application of an $O_2$ plasma.

Figure 29:
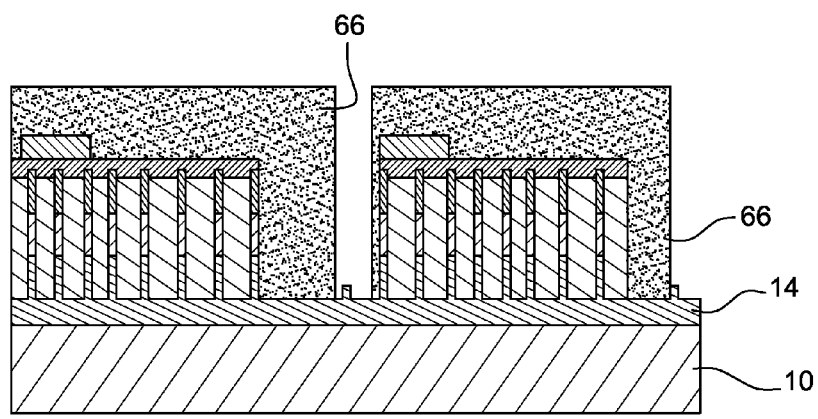

As illustrated in FIG. 29, a new resin mask 66 is then formed by lithography for etching the conductive layer as far as the insulating or semi-insulating substrate 10.

Figure 30:
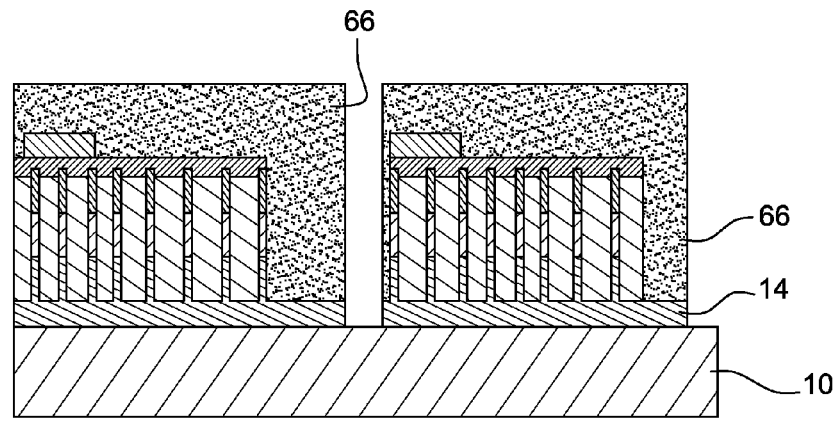

As illustrated in FIG. 30, then a wet etching based on ammonium chloride is carried out in order to etch the non-masked layer portion 14.

Figure 31:
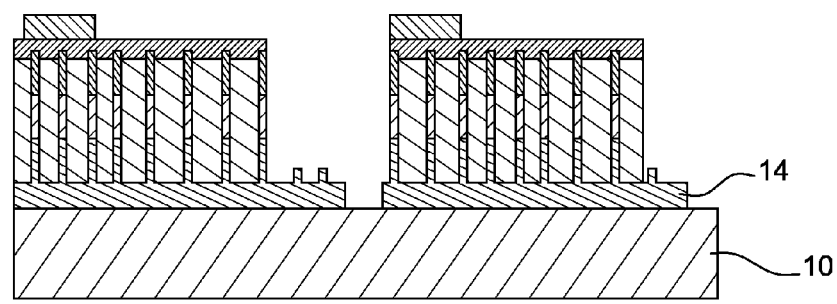

As illustrated in FIG. 31, the resin mask 66 is then removed by acetone and $O_2$ plasma. Advantageously, a metal contact is effected on the first elementary electrode issuing from the buffer layer 14 of each individualised diode, in order to improve the electrical contact between the gold wire subsequently formed and this buffer layer 14.

Figure 32:
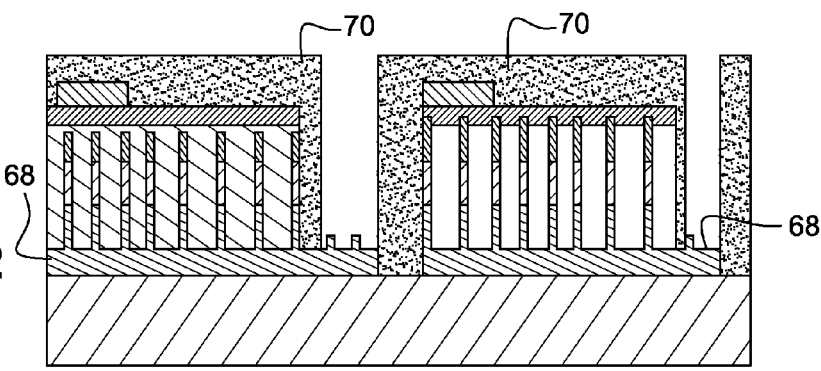
Figure 33:
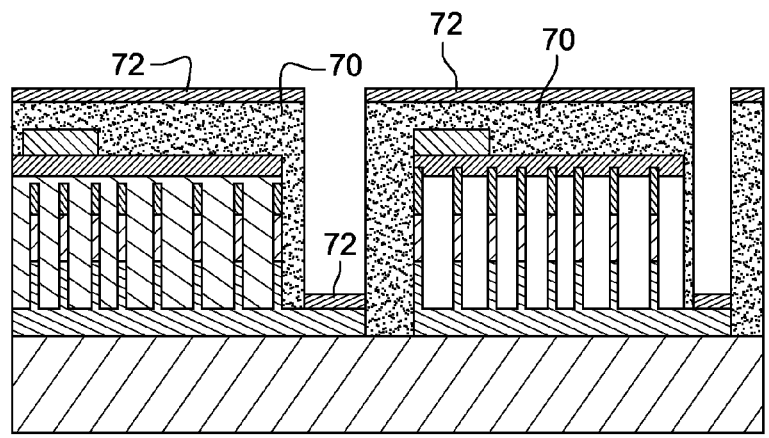

As illustrated in FIGS. 32 and 33, to do this, a new resin mask 70 is formed by photolithography and metal 72 is deposited by evaporation or sputtering on the assembly, such as, for example, a dual layer of Ti/Au or NI/Au material.

Figure 34:
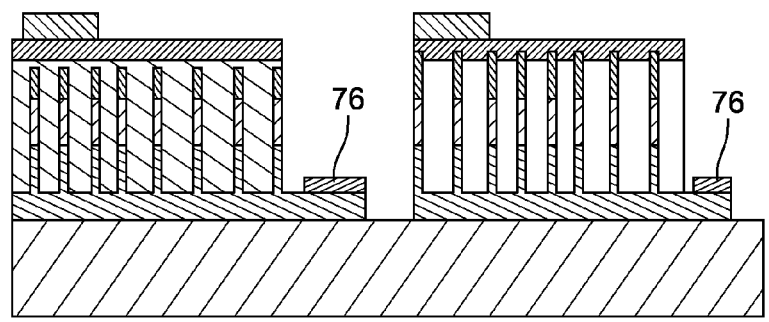

As illustrated in FIG. 34, the resin mask 70 is then removed by acetone or $O_2$ plasma. There thus remains a metal contact take-up area 76 on each first elementary electrode of the diodes.

Figure 35:
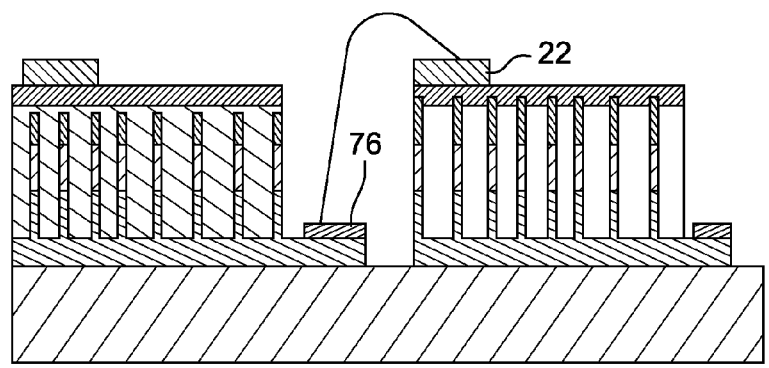

As illustrated in FIG. 35, a wire interconnection between two adjacent diodes is then effected between the contact take-up area 16 of a diode, formed on the first electrode, and the contact take-up area 22 formed on the second electrode of the other diode.

Embodiments have been described in which a nanowire encapsulation layer is used, in particular to offer a flat surface for the second transparent or semi-transparent electrode of the diodes.

Figure 36:
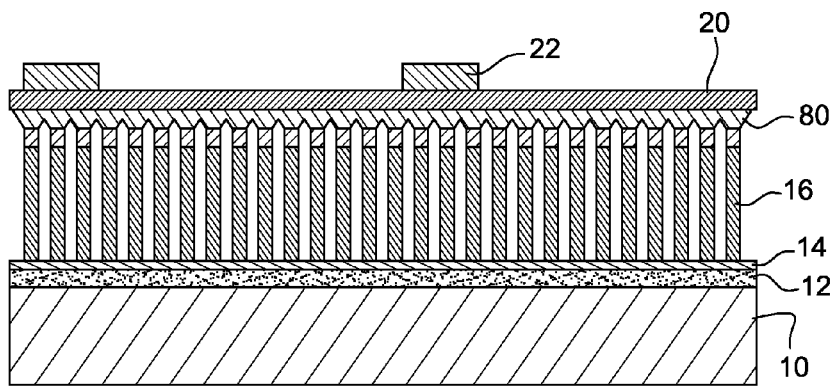
FIGS. 36 to 40 illustrate in more detail the steps of individualisation and electrical connection of the LEDs for dense GaN nanowires and/or ones with a broadened end.

As illustrated in FIG. 36, in a variant, no encapsulation layer is used, and the end of the nanowires is broadened in order to receive the second electrode. In this figure, GaN nanowires 16 are formed on the conductive layer 14 itself formed on the insulating layer 12 deposited on the substrate 10, for example, metal. Each of the nanowires 16 also includes an end 80 which splays in an upward direction towards the top, and thus, has a large flat surface for receiving the second electrode 20. Preferably, the surface density of the nanowires 16 is great so that the splayed ends 80 thereof join in order to form a continuous flat surface.

Figure 37:
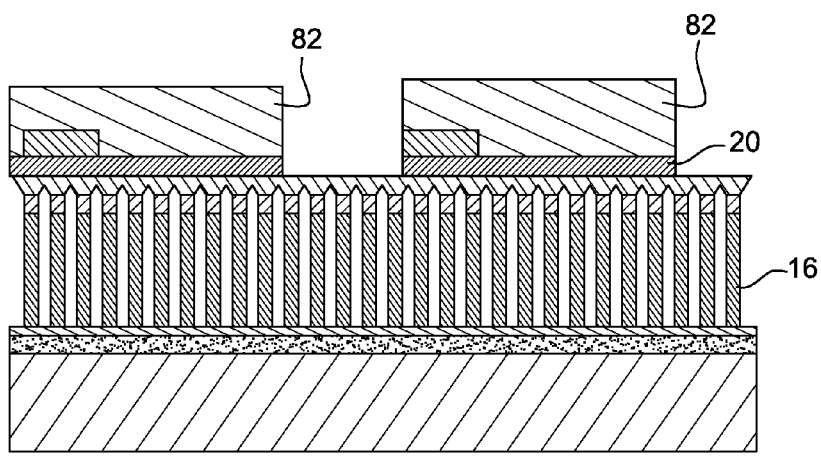

As illustrated in FIG. 37, in a similar manner to the embodiments described previously, the individualisation of the light emitting diodes begins with the formation of a resin mask by photolithography followed by RIE etching of the non-masked layer portion 20, for example, an RIE etching based on methane/hydrogen/argon that does not attack the GaN nanowires 16.

Figure 38:
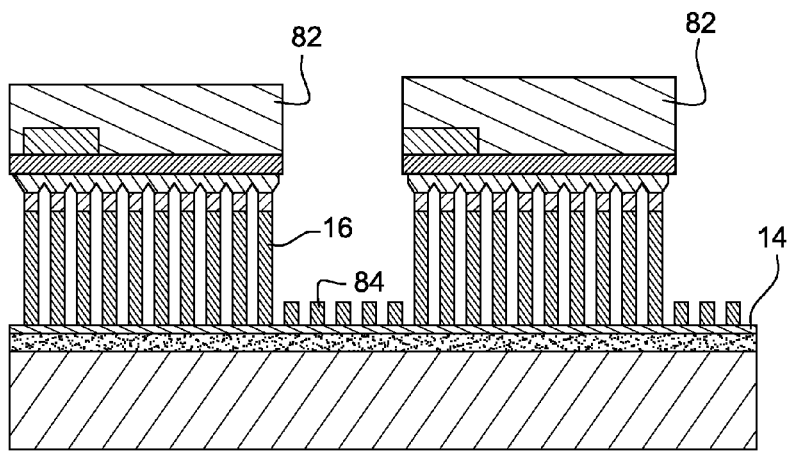

As illustrated in FIG. 38, the individualisation then continues with an RIE etching, based on $SiCl_4/Cl_2$, of the nanowires 16. The conductive layer 14 forming the first electrode is advantageously chosen so as to be substantially inert to this type of RIE etching, and for example, is formed from Pt, Ni, Au, Ag, Ti or TiN. In addition, in order to ensure that the conductive layer 14 is not etched, the etching of the nanowires 16 is stopped before complete elimination thereof, so that residues 84 thereof remain.

Figure 39:
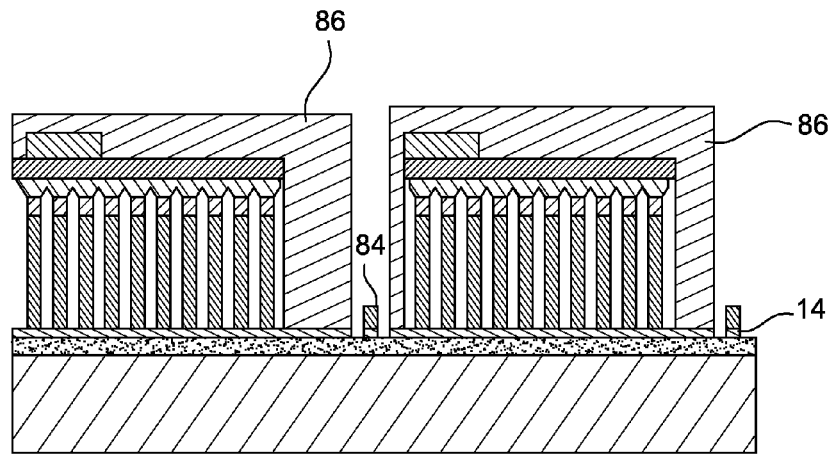

As illustrated in FIG. 39, after having removed the resin mask 82 by way of an acetone bath and by application of an $O_2$ plasma, a new resin mask 86 is formed in order to electrically insulate the diodes, and then etching is carried out of the non-masked portion of the conductive layer 14. When the latter is produced with noble metals of the Pt or Ni type, an IBE etching is used. When the layer 14 is on the other hand formed from Au or Ag, a chemical solution based on iodine and potassium iodide is used. Finally, when the layer 14 is composed of Ti or TiN, a dry etching based on fluorinated chemistry is used. Just like the embodiment illustrated in FIGS. 11 to 21, a wet etching makes it possible to over-etch the layer portion under the nanowire residues 84, which eliminates these.

Figure 40:
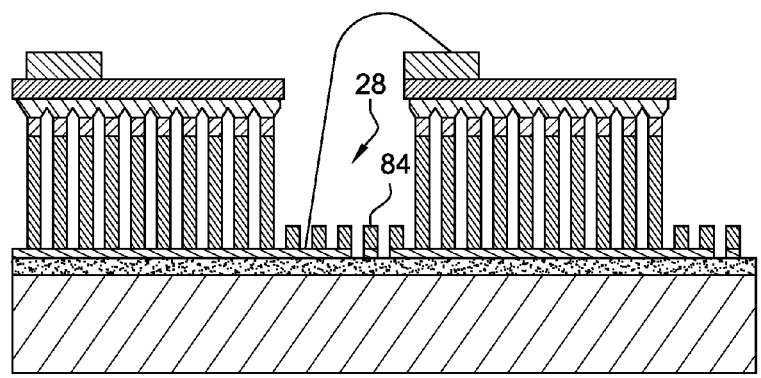

As illustrated in FIG. 40, finally, after having removed the resin mask 86, the individualised diodes are put in series, for example, by way of Au wire interconnections. If nanowire residues interfere with the wire interconnection operation, an additional metal deposition at the bottom of the trench is then carried out in a similar manner to that described and illustrated previously in relation to FIGS. 22 to 35.

Figure 41:
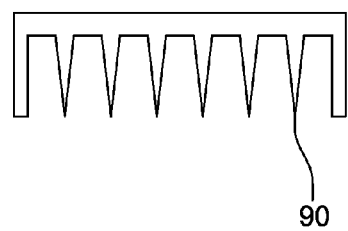
FIG. 41 illustrates a sectional view of an embodiment of a support for the LEDs.

FIG. 41 illustrates a view in section of a preferred embodiment of the substrate 10, which takes the form of a radiator with fins. The size of the radiator, the size of the fins and the distance separating the said fins define in particular the thermal dissipation capacity of the radiator. The latter is thus designed in accordance with the heating power given off by the diode-based light emission device in accordance with the invention, Radiators with high thermal dissipation are, for example, designed by the company SEEM-SEMRAC in Pont-Audemer, France. A few examples of these radiators can be seen at the address http://www.seem-semrac.com/seem/1Dissip/dissipC.htm In addition, the radiator can have channels passing right through it, for circulation of a fluid (for example, cooling by water or air), or the radiator can include structures of the heat pipe type.

By virtue of embodiments of the invention, the following advantages are obtained. The light emitting module in accordance with the invention includes a limited number of thermal resistances. This is because there is no transfer, by brazing, adhesive bonding or other technique, of the light emitting diodes produced. Moreover, all the thermal resistances related to the transfer materials or growth substrate materials or materials of the cans of the prior art are eliminated. The materials of the substrate can be chosen from materials that are good heat conductors, such as metals, for example, which increases further the thermal dissipation. Moreover, it is possible to enhance thermal dissipation by producing light emitting diodes on a substrate in the form of a radiator, for example, having fins, without any transfer.

Further still, the size of the sapphire or SiC substrates normally used in the prior art for producing diodes by epitaxy is generally less than 100 mm in diameter. Since the nanowires in accordance with the invention can be produced on metal, inorganic or ceramic substrates, there is no longer any limit on size for the substrate. Thus a light emission device based on light emitting diodes of the size of a television screen for providing the backlighting of so-called LCD flat screens can be produced. Likewise, it is possible to design lighting on a larger surface, for example the size of a building window or a ceiling.

Even further, the light emitting diodes in accordance with the invention being put electrically in series, there does not exist, therefore, any limitation in the length of the interconnections. Also, the current density injected for supplying the diodes is even over the whole of the diode-based light emission device, thus avoiding the appearance of a hot spot, for example. In addition, putting the diodes electrically in series allows an AC or DC control thereof, for example, by the domestic network voltage. For example, putting 60 diodes in series on a mains voltage of approximately 240 V makes it possible to supply each diode individually at an average voltage of 3 V.

By virtue of the nanowires, it is possible to use a deformable substrate such as a metal sheet, a graphite sheet or the like. It is thus possible to produce a light emission module having particular three-dimensional forms. The substrate can, for example, be wound around a cylinder forming a radiator, or slightly deformed so as to increase the emission angle of the luminaire, it is also possible to envisage a light module in the form of a layer placed, for example, on the arm of a sofa, the shape of which it adopts.

Because the substrate is not removed and remains intact, it is possible to leave free areas on it with interconnection areas on which passive components will be transferred, such as, for example, resistors, capacitors, diodes, active components, such as drivers, or components for managing overvoltages or electrostatic discharges, in particular Zener diodes.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a light emission device based on light emitting diodes, the method comprising:
    forming a support in the form of a heat exchanger, the support having an electrically insulating face;
    forming a first electrode on the electrically insulating face of the support;
    growing semiconducting light-emitting nanowires on the first electrode;
    encapsulating the semiconducting light-emitting nanowires in a planarising material;
    forming, on the planarising material, a second electrode configured to at least partially transmit the light emitted by the semiconducting light-emitting nanowires;
    forming, on the second electrode, electrical contact areas for taking up electrical contact;
    forming the light emitting diodes by:
        releasing bands of the first electrode around each electrical contact area, including: forming a mask defining the bands on the surface of the second electrode; conducting a first chemical etching of the planarising material, and then stopping the first chemical etching so as to preserve planarising material on the first electrode; conducting a second chemical etching of a portion of the semiconducting light-emitting nanowires released from the planarising material during the first chemical etching; and then conducting a third chemical etching of the planarising material remaining at the end of the first chemical etching,
        forming a trench along each of the bands as far as the electrically insulating face of the support; and then
    placing the light emitting diodes in series by electrically connecting the electrical contact areas and the bands of the first electrode.

2. The method of claim 1, wherein forming the support comprises forming thermal dissipation fins on a face opposite to the electrically insulating face.

3. The method of claim 1, wherein forming the support comprises depositing an insulating layer on an electrically conductive substrate.

4. The method of claim 3, wherein the insulating layer is a layer of inorganic material.

5. The method of claim 4, wherein the inorganic material comprises one of diamond, AlN, SiC, BN, or $Si_3N_4$ and $SiO_2$.

6. The method of claim 1, wherein the first electrode comprises:
    a first layer composed of one of Ti, Cr, TiN or WN; and
    a second layer deposited on the first layer, the second layer being composed of one of Cu, Au, Ag, W, Ni and Pd.

7. The method of claim 1, wherein:
    the semiconducting light-emitting nanowires are composed of ZnO; and
    the first electrode is composed of ZnO.

8. The method of claim 1, wherein placing the placing the light emitting diodes in series comprises electrically connecting the electrical contact areas and the bands of the first electrode using Au wire.

9. The method of claim 1, wherein a luminophore material is deposited on the electrical contact areas in order to define and adjust the colour of light emission.

10. A method of manufacturing a light emission device, the method comprising:
    forming a heat exchanger as a support having an electrically insulating face and thermal dissipation fins on a face opposite to the electrically insulating face;
    forming a first electrode on the electrically insulating face of the support;
    growing semiconducting light-emitting nanowires on the first electrode;
    encapsulating the semiconducting light-emitting nanowires in a planarising material such that ends of the semiconducting light-emitting nanowires project beyond the planarising material;
    forming, on the planarising material, a second electrode which encompasses the ends of the nanowires, the second electrode being at least partially transparent to the light emitted by the semiconducting light-emitting nanowires;
    forming contact areas on the second electrode;
    forming the light emitting diodes by:
        releasing bands of the first electrode around each contact area, including: forming a mask defining the bands on the second electrode; conducting a first chemical etching of the planarising material, and then stopping the first chemical etching so as to preserve planarising material on the first electrode; conducting a second chemical etching of a portion of the semiconducting light-emitting nanowires released from the planarising material during the first chemical etching; and then conducting a third chemical etching of the planarising material remaining at the end of the first chemical etching,
        forming a trench along each of the bands as far as the electrically insulating face of the support;
    placing the light emitting diodes in series by electrically connecting the contact areas and the bands of the first electrode;

defining and adjusting the emission colour of light emitted by the light emitting diodes by depositing a luminophore material on the contact areas.

11. The method of claim 10, wherein forming the support comprises depositing an insulating layer on an electrically conductive substrate.

12. The method of claim 11, wherein the insulating layer comprises an inorganic material.

13. The method of claim 12, wherein the inorganic material comprises one of diamond, AlN, SiC, BN, or $Si_3N_4$ and $SiO_2$.

14. The method of claim 10, wherein the first electrode comprises:
a first electrode layer; and
a second electrode layer deposited on the first electrode layer.

15. The method of claim 14, wherein:
the first electrode layer comprises a first metal material; and
the second electrode layer comprises a second metal material having a high electrical conductivity.

16. The method of claim 15, wherein:
the first metal material comprises one of Ti, Cr, TiN and WN; and
the second metal material comprises one of Cu, Au, Ag, W, Ni and Pd.

17. The method of claim 10, wherein the semiconducting light-emitting nanowires and the first electrode are composed of the same material.

18. The method of claim 10, wherein electrically connecting the electrical contact areas and the bands of the first electrode is done using Au wire.

19. The method of claim 10, further comprising depositing a luminophore material on the electrical contact areas in order to define and adjust a colour of light emission.

20. A method of manufacturing a light emission device, the method comprising:
forming a heat exchanger as a support having an electrically insulating face;
forming a first electrically conductive layer on the electrically insulating face of the support;
growing semiconducting light-emitting nanowires on the first electrically conductive layer;
encapsulating the semiconducting light-emitting nanowires in a planarising material such that ends of the semiconducting light-emitting nanowires project beyond the planarising material;
forming, on the planarising material, a second electrically conductive layer which encompasses the ends of the nanowires, the second electrically conductive layer being at least partially transparent to the light emitted by the semiconducting light-emitting nanowires;
forming contact areas on the second electrically conductive layer;
forming the light emitting diodes by:
releasing bands of the first electrically conductive layer around each contact area, including: forming a mask defining the bands on the second electrically conductive layer; conducting a first chemical etching of the planarising material, and then stopping the first chemical etching so as to preserve planarising material on the first electrically conductive layer; conducting a second chemical etching of a portion of the semiconducting light-emitting nanowires released from the planarising material during the first chemical etching; and then conducting a third chemical etching of the planarising material remaining at the end of the first chemical etching,
forming a trench along each of the bands as far as the electrically insulating face of the support; and then
electrically connecting the light emitting diodes by depositing a passivation layer partially on each contact area and a bottom of the trench, and then depositing a metal layer on a free surface of each contact area, the trench and partially on the first elementary electrode of an adjacent light emitting diode.

* * * * *